United States Patent
Kim et al.

(10) Patent No.: US 11,236,869 B2
(45) Date of Patent: Feb. 1, 2022

(54) LIGHT EMITTING DEVICE AND LIGHT APPARATUS FOR PLANT GROWTH

(71) Applicant: Samsung Electronics Co., Ltd., Suwon-si (KR)

(72) Inventors: Chohui Kim, Hwaseong-si (KR); Seulgee Lee, Suwon-si (KR); Sungwoo Choi, Suwon-si (KR); Inhyung Lee, Hanam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 16/901,478

(22) Filed: Jun. 15, 2020

(65) Prior Publication Data

US 2021/0123573 A1 Apr. 29, 2021

(30) Foreign Application Priority Data

Oct. 23, 2019 (KR) ........................ 10-2019-0131890

(51) Int. Cl.
| | |
|---|---|
| *F21K 9/64* | (2016.01) |
| *F21V 23/00* | (2015.01) |
| *A01G 7/04* | (2006.01) |
| *F21Y 115/10* | (2016.01) |

(52) U.S. Cl.
CPC ................ *F21K 9/64* (2016.08); *A01G 7/045* (2013.01); *F21V 23/005* (2013.01); *F21Y 2115/10* (2016.08)

(58) Field of Classification Search
CPC ..... F21K 9/64; F21K 9/60; F21K 9/62; F21V 23/005; A01G 7/045; A01G 9/249; A01G 7/04; F21Y 2115/10; Y02A 40/25; Y02P 60/14; Y02P 60/00; H01L 33/387; H01L 33/62; H01L 33/382; H01L 33/504; H01L 2224/48247; H01L 33/50; H01L 33/506; F21W 2131/109

See application file for complete search history.

(56) References Cited

U.S. PATENT DOCUMENTS

| | | | |
|---|---|---|---|
| 6,372,608 | B1 | 4/2002 | Shimoda et al. |
| 6,414,426 | B1 | 7/2002 | Akashi et al. |
| 6,645,830 | B2 | 11/2003 | Shimoda et al. |
| RE38,466 | E | 3/2004 | Inoue et al. |
| 6,818,465 | B2 | 11/2004 | Biwa et al. |

(Continued)

FOREIGN PATENT DOCUMENTS

| | | |
|---|---|---|
| EP | 2881968 A1 | 6/2015 |
| JP | 2008311532 A | 12/2008 |

(Continued)

*Primary Examiner* — Joseph L Williams
*Assistant Examiner* — Jose M Diaz
(74) *Attorney, Agent, or Firm* — Harness, Dickey & Pierce, P.L.C.

(57) ABSTRACT

A light emitting device for plant growth includes a blue light emitting diode (LED) configured to emit blue light, and at least one wavelength converting material configured to be excited by the blue light and convert the blue light into light having a different wavelength, the converted light being light for plant growth. An emission spectrum of the light for plant growth is when a photosynthetic photon flux (PPF) in a 400 nm to 500 nm band is 1, a PPF in a 500 nm to 600 nm band is in a range of 6 to 10, and a PPF in a 600 nm to 700 nm is in a range of 5 to 7.

20 Claims, 9 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,500,326 B2 | 11/2016 | Kanahira |
| 2013/0187180 A1 | 7/2013 | Chen |
| 2016/0178140 A1 | 6/2016 | Cho |
| 2016/0312118 A1* | 10/2016 | Fiedler ............... C09K 11/0883 |
| 2017/0343168 A1 | 11/2017 | Ting et al. |
| 2018/0000016 A1* | 1/2018 | Amiya .................. H01L 33/504 |
| 2019/0055468 A1 | 2/2019 | Oepts et al. |
| 2019/0288165 A1* | 9/2019 | Amiya ................ H01L 25/0753 |

FOREIGN PATENT DOCUMENTS

| | | |
|---|---|---|
| JP | 2013059348 A | 4/2013 |
| JP | 2017127273 A | 7/2017 |
| JP | 6401047 B2 | 10/2018 |
| WO | WO-2014021049 A1 | 2/2014 |
| WO | WO-2014204108 A1 | 12/2014 |
| WO | WO-2017059124 A1 | 4/2017 |

* cited by examiner

LIGHT EMITTING DEVICE AND LIGHT APPARATUS FOR PLANT GROWTH

CROSS-REFERENCE TO RELATED APPLICATION(S)

This application claims benefit of priority under 35 USC § 119 to Korean Patent Application No. 10-2019-0131890 filed on Oct. 23, 2019 in the Korean Intellectual Property Office, the disclosure of which is incorporated herein by reference in its entirety.

BACKGROUND

1. Field

The present disclosure relates to a light emitting device and a light apparatus for plant growth.

2. Description of Related Art

As a cultivation method to reduce an uncertainty in food production, due to factors such as climate change, protected crop production in a facility such as a greenhouse or a plant factory is actively increasing in order to reduce or minimize an influence of an external climate and to stably produce food. Such protected crop production not only enables continuous production throughout the year through environmental management, but also improves crop yield and/or quality thereof.

In protected crop production, it may be important to secure light for plant growth since a greenhouse or a plant factory cannot directly use sunlight.

As a method for securing sufficient light for plant growth, artificial light such as light from a light emitting diode (LED) has been in the spotlight. Such LED lighting may not only have sufficient light efficiency, but may also allow for the selection of a specific desired wavelength of light, which are advantages that can be realized with a miniature lighting device.

SUMMARY

An aspect of the present disclosure is to provide a light emitting device capable of ensuring efficient photosynthesis through light penetration while satisfying an absorption spectrum for plant growth.

Another aspect of the present disclosure is to provide a light apparatus for plant growth capable of ensuring efficient photosynthesis through light transmission while satisfying an absorption spectrum for plant growth.

According to an aspect of the present disclosure, a light emitting device for plant growth includes a blue light emitting diode (LED) configured to emit blue light, and at least one wavelength converting material configure to be excited by the blue light and convert a portion of the blue light into converted light having a different wavelength, the converted light being light for plant growth. An emission spectrum of the light for plant growth is when a photosynthetic photon flux (PPF) of a 400 nm to 500 nm band is 1, a PPF of a 500 nm to 600 nm band is in a range of 6 to 10, and a PPF of a 600 nm to 700 nm band is in a range of 5 to 7.

According to an aspect of the present disclosure, a light emitting device for plant growth includes a blue light emitting diode configured to emit blue light having a dominant wavelength in a range of 430 nm to 470 nm; a first wavelength converting material configure to be excited by the blue light and emit light having a peak wavelength in a range of 490 nm to 580 nm; and a second wavelength converting material configure to be excited by the blue light and emit light having a peak wavelength in a range of 620 nm to 660 nm. Light for plant growth is emitted by mixing the blue light with the first and second light, an emission spectrum of the light for plant growth is when a photosynthetic photon flux (PPF) of a 400 nm to 500 nm band is 1, a PPF of a 500 nm to 600 nm band is in a range of 6 to 10, a PPF of a 600 nm to 700 nm band is in a range of 5 to 7, and the light for plant growth has an x coordinate in a range of 0.3531 to 0.4939 and a y coordinate in a range of 0.4150 to 0.5665 in a CIE 1931 color coordinate system.

According to aspect of the present disclosure, a light apparatus for plant growth includes a circuit board; and a plurality of white light emitting devices mounted on the circuit board. The plurality of white light emitting devices include a blue light emitting diode (LED) configured to emit blue light, and at least one wavelength converting material configure to be excited by the blue light and convert a portion of the blue light into converted light having a different wavelength, the plurality of white light emitting devices including a plurality of first light emitting devices configured to emit light for plant growth. An emission spectrum of the light for plant growth is when a photosynthetic photon flux (PPF) of a 400 nm to 500 nm band is 1, a PPF of a 500 nm to 600 nm band is in a range of 6 to 10, and a PPF of a 600 nm to 700 nm band is 5 to 7.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described in detail with reference to the accompanying drawings.

Figure 1:
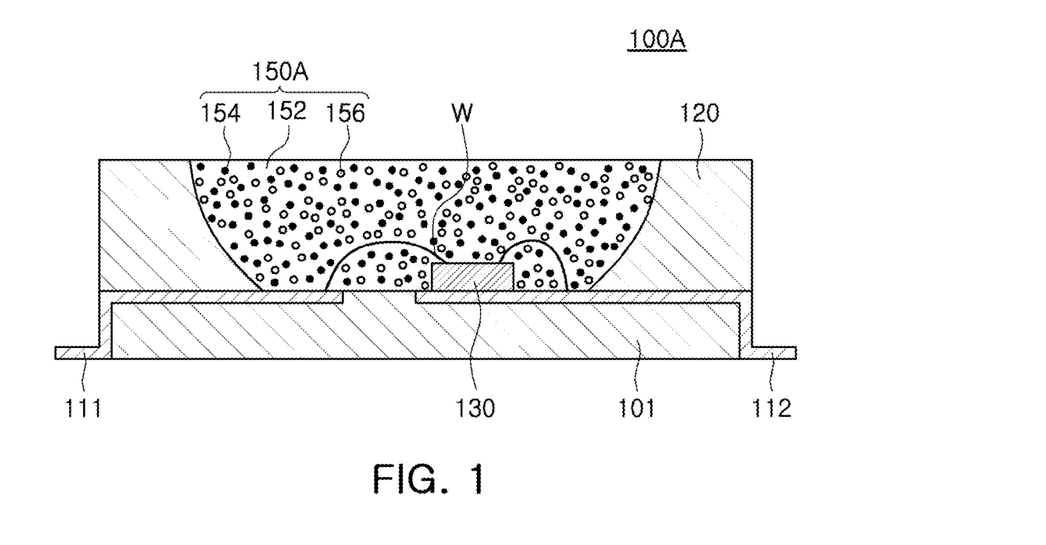
FIG. 1 is a schematic cross-sectional view illustrating a light emitting device for plant growth according to example embodiments of the present disclosure.

FIG. 1 is a schematic cross-sectional view illustrating a light emitting device for plant growth according to example embodiments of the present disclosure.

Referring to FIG. 1, a light emitting device 100A for plant growth according to example embodiment may include a package substrate 101, a blue light emitting diode (LED) 130, and/or a wavelength converter 150 disposed on the package substrate 101. In addition, the light emitting device 100A may further include a pair of lead frames 111 and 112 electrically connected to the blue LED 130, a body part 120 having a cup shape, and/or a conductive wire W connecting the blue light emitting diode (LED) 130 and the lead frames 111 and 112.

For example, the package substrate 101 may be formed of an opaque resin or a resin having a high reflectance, and may be made of a polymer resin that is easy to inject and contains high reflective powder. In addition, the package substrate 101 may be made of ceramic, and in some example embodiments, heat dissipation may be more easily performed. In some example embodiments, the package substrate 101 may be a printed circuit board having wiring patterns replacing the lead frames 111 and 112.

A sidewall reflector 120 may be disposed on the package substrate 101 and the lead frames 111 and 112 to form a cavity C that accommodates the blue LED 130. The sidewall reflector 120 may have a cup shape to improve reflection efficiency of light, but is not limited thereto. In some example embodiments, the sidewall reflector 120 may be integrally formed with the package substrate 101.

The blue LED 130 may be disposed on an upper surface of the package substrate 101, and may include an epitaxially grown semiconductor layer. The blue LED 130 may be configured to emit blue light having a dominant wavelength in a range of 430 nm to 470 nm.

The wavelength converter 150A may include a plurality of wavelength converting materials 154 and 156 disposed on an optical path of the blue LED 130, and excited by blue light emitted from the blue LED 130 so that light for plant growth is finally emitted to convert the blue light into light having a different wavelength.

The final emission light of the light for plant growth 100A according to example embodiments may have a condition of an absorption spectrum for plant growth so as to be suitable for artificial light for plant growth, that is, a spectrum for improving light transmittance in terms of efficiency of photosynthesis while satisfying a ratio of red light.

For example, plants receive energy through light and grow through photosynthesis and respiration. Therefore, there is a wavelength band and intensity of light suitable for growth depending on plants. White light employed in example embodiments may improve plant growth by enhancing a ratio of green light while sufficiently securing a ratio of red light to increase an amount of light for substantial photosynthesis.

Figure 2:
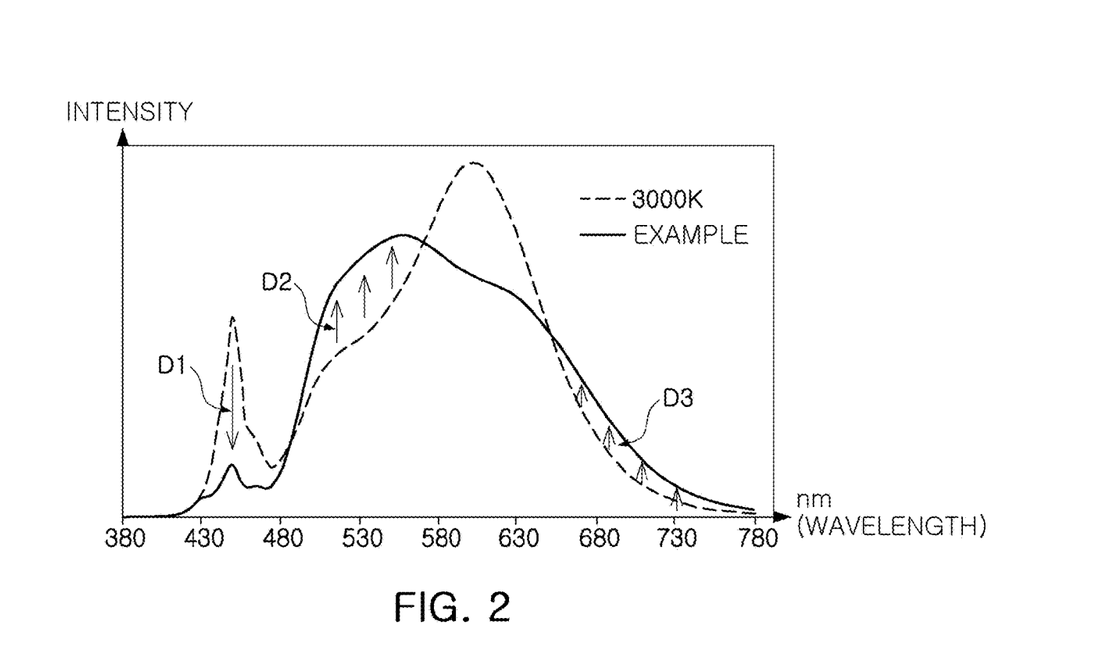
FIG. 2 illustrates an emission spectrum of light according to example embodiments of the present disclosure.

FIG. 2 illustrates an emission spectrum of while light according to example embodiments of the present disclosure. In FIG. 2, an emission spectrum of warm while light (e.g., 3000K), which is mainly used as a conventional light for plant growth, is illustrated, together with the emission spectrum of white light according to example embodiments.

Referring to FIG. 2, compared to the conventional warm while light, the while light according to example embodiments may be relatively significantly enhanced (see. D2). In addition, the ratio of red light may be maintained in order to sufficiently secure or may be slightly increased as illustrated in FIG. 2 (see. D3). As described above, it is possible to increase an amount of light for substantial photosynthesis while maintaining absorption spectrum conditions suitable for plant growth.

Since the white light emitting device 100A according to example embodiments employs a method of securing other visible light portions of red and green as wavelength converting materials while employing one blue LED 130, a LED chip of additional monochromatic light may not be used. Therefore, as described above, when enhancing the ratio of green light through the wavelength converting material, as illustrated in FIG. 2, the ratio of blue light may be reduced compared to the conventional warn while (see. D1).

Example embodiments provide a method to limit the above-described spectral conditions for plant growth to photosynthetic photon flux (PPF) for the ratio of green light as well as the ratio of red light. Conventional light for plant growth was only interested in the photosynthetic photon flux (PPF) of a red light or entire visible light band (e.g., a 400 nm to 700 nm band), but example embodiments divide a visible light band into a plurality of wavelength bands to provide conditions of light to improve the plant growth by considering the PPF conditions of green light as well as the PPF conditions of red light.

Here, the photosynthetic photon flux (PPF) refers to a total amount of photosynthetically active radiation (PAR) generated per second by a light apparatus. In general, the measurement of PPF may be performed using a device such as an integrating sphere that essentially captures and measures all photons emitted by the light apparatus. A unit of PPF is micromolar (μmol/s) per second, but in example embodiments, it is represented as a ratio based on the PPF in a blue band.

Figure 3:
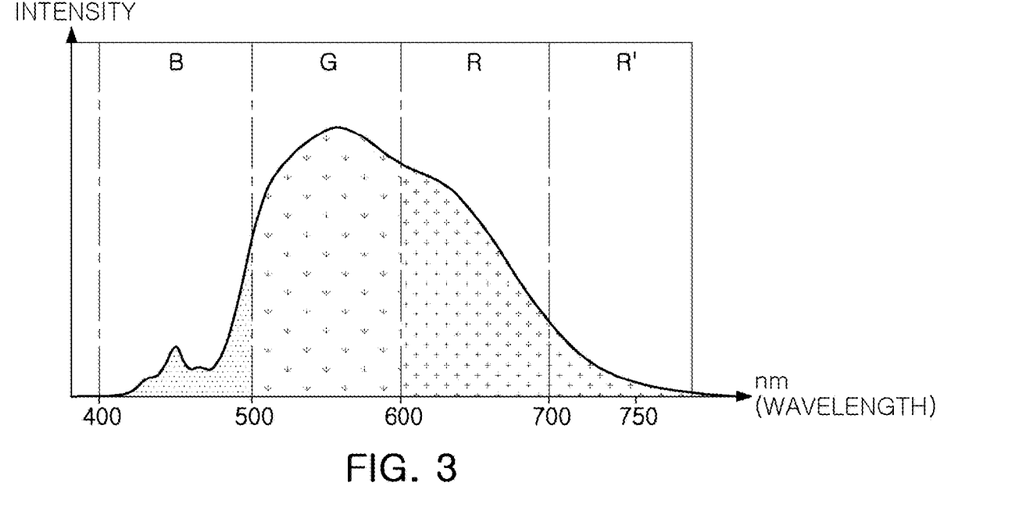
FIG. 3 illustrates an emission spectrum of FIG. 2 illustrating a PPF condition according to example embodiments of the present disclosure.

FIG. 3 illustrates an emission spectrum for explaining PPF conditions of the light for plant growth according to example embodiments.

Referring to FIG. 3, a visible light band of the emission spectrum is largely divided into a 400 nm to 500 nm band (B), a 500 nm to 600 nm band (G), and a 600 nm to 700 nm band (R). In the present disclosure, the 400 nm to 500 nm band (B), the 500 nm to 600 nm band (G), and the 600 nm to 700 nm band (R) may be represented by blue, green, and red bands, respectively, although other conventional wavelength ranges may also be used.

The emission spectrum of light for plant growth satisfies a condition in which when a PPF of a 400 nm to 500 nm band (B) is 1, a PPF of a 500 nm to 600 nm band (G) is in a range of 6 to 10, and a PPF of a 600 nm to 700 nm band (R) is in a range of 5 to 7. The PPF conditions will be described in detail with reference to FIGS. 7 and 8.

In some example embodiments, the PPF of the 500 nm to 600 nm band (G) may be in a range of 7 to 9. A band (R') of 700 nm or more may also have a predetermined, or alternatively, desired PPF value. For example, the PPF of the band (R') of 700 nm or more may be present in 0.5 or more when the PPF of the 400 nm to 600 nm band (B) is 1, and in some example embodiments, the PPF of the band (R') of 700 nm or more may be 1.5 or less.

In example embodiments, the wavelength converter 150A may be disposed in a cavity C of the sidewall reflector 120. The wavelength converter 150A may include an encapsulation layer 152, and a first wavelength converting material 154 and a second wavelength converting material 156 contained in the encapsulation layer 152. The encapsulation layer 152 may be made of a light transmissive resin, for example, epoxy, silicone, modified silicone, urethane resin, oxetane resin, acrylic, polycarbonate, polyimide, and combinations thereof.

The plurality of wavelength converting materials include first and second wavelength converting materials 154 and 156 emitting light having different wavelengths. The first wavelength converting material 154 may be configured to convert the blue light into first light having a peak wavelength of 500 nm to 580 nm, and the second wavelength converting material 156 may be configured to convert the blue light into second light having a peak wavelength of 660 nm to 660 nm. In some example embodiments, the first wavelength converting material 154 may be configured to convert the blue light into light having a peak wavelength of 530 nm to 560 nm, and the second wavelength converting material 156 may be configured to convert the blue light into light having a peak wavelength of 610 nm to 650 nm.

The first and second wavelength converting materials 154 and 156 may include a phosphor, a quantum dot, or a combination thereof, respectively. For example, the first wavelength material 154 may include at least one phosphor selected from a group consisting of $(Ga,Gd,Y,Lu)_3Al_5O_{12}$:Ce, $La_3Si_6N_{11}$:Ce, $(Sr,Ca,Ba)Si_2O_2N_2$:Eu, $(Sr,Ba)_2SiO_4$:Eu, β-SiAlON:Eu, and combinations thereof, and the second wavelength converting material 156 may include at least one phosphor selected from a group consisting of $(Sr,Ca)AlSiN_3$:Eu, $K_xSiF_y$:Mn$^{4+}$ ($2 \leq x \leq 3$, $4 \leq y \leq 7$), and combinations thereof.

In a particular example embodiment, the first wavelength converting material 154 may include $(Ga,Gd,Y,Lu)_3Al_5O_{12}$:Ce, such as $Lu_3Al_5O_{12}$:Ce or $Y_3Al_5O_{12}$:Ce, and the second wavelength converting material 156 may include $(Sr,Ca)AlSiN_3$:Eu such as $CaAlSiN_3$:Eu.

At least one of the first and second wavelength converting materials may include a plurality of phosphors configured to convert light having different peaks. For example, in example embodiments, the first wavelength converting material 154 related to a green band (that is, 500 nm to 600 nm band), which is relatively enhanced, may be comprised of two or more phosphors. This example embodiment is illustrated in FIG. 4.

Figure 4:
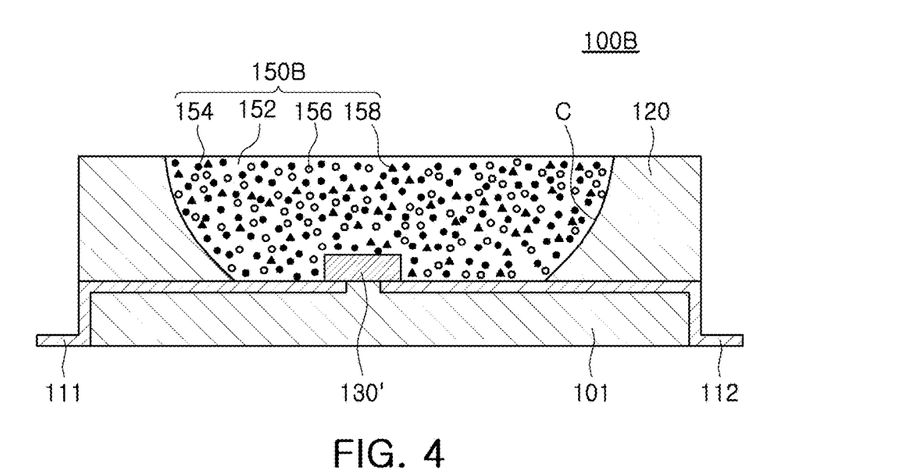
FIG. 4 is a schematic cross-sectional view illustrating a light emitting device for plant growth according to example embodiments of the present disclosure.

FIG. 4 is a schematic cross-sectional view illustrating a light emitting device for plant growth according to example embodiments of the present disclosure.

Referring to FIG. 4, a light emitting device 100B according to example embodiments can be understood that as similar to the light emitting device 100A illustrated in FIG. 1, except that the light emitting device 100B further includes a third wavelength converting material 158, and a blue LED 130' is mounted in a flip chip method. In addition, the configuration of example embodiments may be understood with reference to the description of the same of similar components of the light emitting device 100A illustrated in FIG. 1, unless otherwise stated.

A wavelength converter 150B employed in example embodiments may further include a third wavelength converting material 158 in addition to the first and second wavelength converting materials 154 and 156. The third wavelength converting material 158 may be configured to emit light having a wavelength from that of the first wavelength converting material 154 in the 500 nm to 600 nm band. In some example embodiments, the first and third wavelength converting materials 154 and 158 may be phosphors configured to emit light of any one of green, yellow, and orange.

For example, the first and third wavelength converting materials 154 and 158 may be phosphors selected from $(Ga,Gd,Y,Lu)_3Al_5O_{12}$:Ce, $La_3Si_6N_{11}$:Ce, $(Sr,Ca,Ba)Si_2O_2N_2$:Eu, $(Sr,Ba)_2SiO_4$:Eu, and β-SiAlON:Eu.

The blue LED 130' may be connected to lead frames 111 and 112 in a flip chip manner. In the above-described example embodiment, although an electrical connection between the lead frames 111 and 112 and the blue LED 130 is illustrated in a form implemented by a wire W, but it may be directly connected to the lead frames 111 and 112 using a conductive bump (not shown) when the blue LED 130' employed in example embodiments has a flip-chip structure. As described above, a LED chip that can be employed in the light emitting device according to example embodiments of the present disclosure may have various structures.

Figure 5:
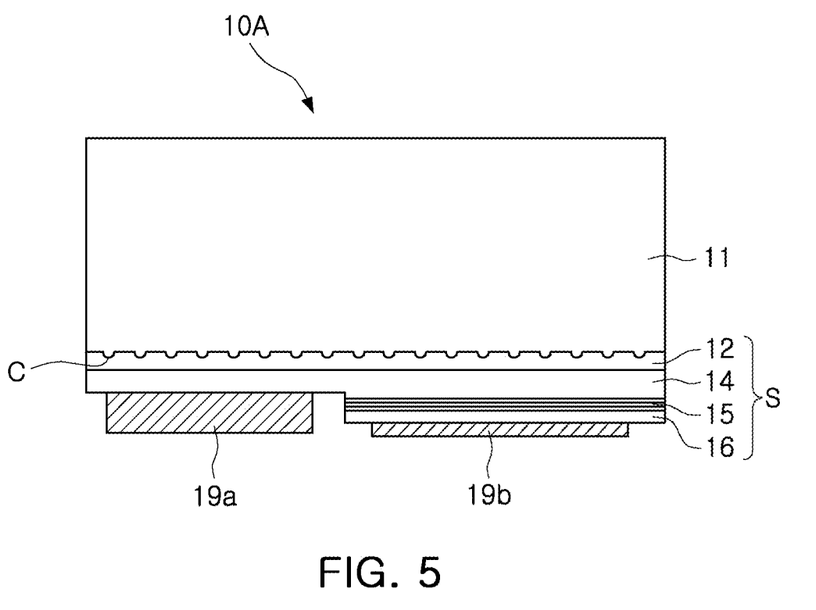
FIGS. 5 and 6 are cross-sectional views illustrating various examples of LED chips that can be employed in the light emitting device for plant growth according to example embodiments of the present disclosure.
Figure 6:
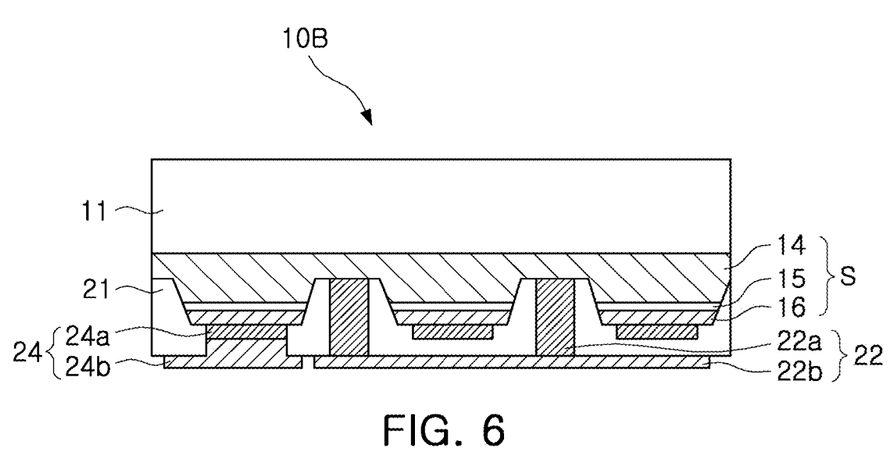

FIGS. 5 and 6 are cross-sectional views illustrating examples of various LED chips that can be employed in a blue LED of a white light emitting device according to example embodiments of the present disclosure.

Referring to FIG. 5, a LED chip 10A employed in example embodiments may include a substrate 11 and a semiconductor laminate S disposed on the substrate 11. The semiconductor laminate S may include a first conductive semiconductor layer 14, an active layer 15, and/or a second conductive semiconductor layer 16, sequentially disposed on the substrate 11. A buffer layer 12 may be further disposed between the substrate 11 and the first conductive semiconductor layer 14.

The substrate 11 may be an insulating substrate such as sapphire. However, the present inventive concepts are not limited thereto, and the substrate 11 may be a conductive or a semiconductor substrate in addition to the insulating substrate. For example, the substrate 11 may be SiC, Si, $MgAl_2O_4$, MgO, $LiAlO_2$, $LiGaO_2$, and GaN in addition to sapphire. Unevenness C may be formed on an upper surface of the substrate 11. The unevenness C may improve a quality of a single crystalline grown while improving light extraction efficiency.

The buffer layer 12 may be $In_xAl_yGa_{1-x-y}N$ ($0 \leq x \leq 1$, $0 \leq y \leq 1$). For example, the buffer layer 12 may be GaN, AlN, AlGaN, InGaN. If necessary, the buffer layer 12 may be used by combining a plurality of layers or gradually changing a composition thereof.

The first conductive semiconductor layer 14 may be a nitride semiconductor satisfying n-type $In_xAl_yGa_{1-x-y}N$ ($0 \leq x \leq 1$, $0 \leq y < 1$, $0 \leq x+y < 1$), and a n-type impurity may be Si. For example, the first conductive semiconductor layer 14 may include n-type GaN. The second conductive semiconductor layer 16 may be a nitride semiconductor layer 16 satisfying p-type $In_xAl_yGa_{1-x-y}N$ ($0 \leq x \leq 1$, $0 \leq y < 1$, $0 \leq x+y < 1$), and a p impurity may be Mg. For example, the second conductive semiconductor layer 16 may be implemented in a single layer structure, but as in the present example, may have a multi-layer structure having different compositions.

The active layer 15 may have a multi-quantum well (MQW) structure in which a quantum well layer and a quantum barrier layer are alternately stacked. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 < x \leq 1$), and the quantum barrier layer may be GaN or AlGaN. Thicknesses of the quantum well layer and the quantum barrier layer may be in a range of 1 nm to 50 nm. The active layer 15 is not limited to a multi-quantum well structure, and may have a single quantum well structure.

The first and second electrodes 19a and 19b may be disposed in a mesa-etched region of the first conductive semiconductor layer 14 and the second conductive semiconductor layer 16, respectively, such that they are located on the same surface (first surface). The first electrode 19a is not limited thereto, but may include a material such as Ag, Ni, Al, Cr, Rh, Pd, Ir, Ru, Mg, Zn, Pt, Au, or the like, and may be employed in a single layer structure or a structure having two layers or more. In some example embodiments, the second electrode 19b may include a transparent electrode such as a transparent conductive oxide or a transparent conductive nitride, or may include graphene. The second electrode 19b may include at least one of Al, Au, Cr, Ni, Ti, and Sn.

Referring to FIG. 6, a LED chip 10B according to example embodiments may be understood to be similar to the LED chip 10A shown in FIG. 5 except for an electrode structure and a related structure thereof. The description of the components of example embodiments may refer to the description of the same or similar components as the LED chip 10A shown in FIG. 5, unless specifically stated otherwise.

The LED chip 10B includes first and second electrode 22 and 24, connected to the first and second conductive semiconductor layers 14 and 16, respectively. The first electrode 22 may include a connection electrode portion 22a penetrating through the second conductive semiconductor layer 16 and the active layer 15 to be connected to the first conductive semiconductor layer 14 and a first electrode pad 22b connected to the connection electrode portion 22a. The connection electrode portion 22a may have a structure such as a conductive via. The connection electrode portion 22a may be surrounded by an insulating portion 21 to be electrically separated from the active layer 15 and the second conductive semiconductor layer 16. The connection electrode 22a may be disposed in a region in which the semiconductor laminate S is etched. The connection electrode portion 22a may be designed appropriately in numbers, shapes, pitches, or contact areas with the first conductive semiconductor layer 14 such that contact resistance is lowered. In addition, the connection electrode portion 22a may be arranged to form rows and columns on the semiconductor laminate S, thereby improving current flow. The second electrode 24 may include an ohmic contact layer 24a and a second electrode pad 24b on the second conductive semiconductor layer 16.

The connection electrode portion 22a and the ohmic contact layer 24a may be configured such that the conductive semiconductor layers 14 and 16 and a conductive material having an ohmic characteristic may include a single layer or a multi-layer structure, respectively. For example, the connection electrode portion 22a and the ohmic contact layer 24a may be formed by depositing or sputtering one or more of a metal such as Ag, Al, Ni, and Cr, and a transparent conductive oxide (TCO) such as ITO.

The first and second electrode pads 22b and 24b may be respectively connected to the connection electrode portion 22a and the ohmic contact layer 24a to function as external terminals of the semiconductor light emitting diode chip 10B. For example, the first and second electrode pads 22b and 24b may be Au, Ag, Al, Ti, W, Cu, Sn, Ni, Pt, Cr, NiSn, TiW, AuSn, or eutectic metals thereof.

The first and second electrodes 22 and 24 may be disposed in the same direction, and may be mounted in a so-called flip-chip form. The two electrodes 22 and 24 may be electrically separated from each other by the insulating portion 21. In the insulating portion 21, any material as long as it has an electrically insulating characteristic may be used, and any of materials having electrical insulating properties may be employed, but a material having a lower light absorption ratio may be used. For example, a silicon oxide or a silicon nitride may be used. If necessary, light reflective powder may be dispersed in the light transmissive material to form a light reflective structure. Alternatively, the insulating portion 121 may have a multilayer reflective structure in which a plurality of insulating films having different refractive indices are alternately stacked. For example, the multilayer reflective structure may be a distributed bragg reflector (DBR) in which a first insulating film having a first refractive index and a second insulating film having a second refractive index are alternately stacked.

In the multilayer reflective structure, the plurality of insulating films having different refractive indices may be repeatedly stacked 2 to 100 times. For example, the multilayer reflective structure may be repeatedly stacked 3 to 70 times, and further may be repeatedly stacked 4 to 50 times. The plurality of insulating films of the multilayer reflective structure may be oxides or nitrides of $SiO_2$, $SiN$, $SiO_xN_y$, $TiO_2$, $Si_3N_4$, $Al_2O_3$, $TiN$, $AlN$, $ZrO_2$, $TiAlN$, $TiSiN$, and combinations thereof. The refractive indices may be determined in a range of about 1.4 to 2.5, and may be a value, smaller than the refractive index of the first conductive semiconductor layer 14 and the refractive index of the substrate 11, but may have a value smaller than the refractive index of the first conductive semiconductor layer 14 but greater than the refractive index of the substrate 11.

Although the light emitting device that can be employed in example embodiments is described through the above-described example embodiments 100A and 100B, they may have various package structures in addition to the described structure. For example, the sidewall reflector 120 may not be employed. In some example embodiments, the wavelength converters 150A and 150B may be provided in a film form composed of at least some wavelength converting materials.

Hereinafter, conditions of light for plant growth employed in example embodiments, that is, conditions of PPF ratios for each wavelength band will be described in detail.

A blue LED of 445 nm and green and red phosphors were combined to produce a light emitting device emitting device emitting light of various spectra. PPF values were measured by dividing an entire visible light band of the emission light into the blue, green and red bands, that is, the 400 nm to 500 nm band, the 500 nm to 600 nm band, and the 600 nm to 700 nm band. The spectrum of white light having a color temperature of 3000K was measured as reference light (Comparative Example 1).

As shown in Table 1 below, in the white light according to Comparative Example 1, a green PPF ratio and a red PPF ratio were 4 and 4, respectively, when the blue PPF was 1. In an irradiation environment using the reference light (Comparative Example 1), growth results of leafy vegetables and herbs performed for a certain period of time were evaluated by an average growth amount (e.g., average growth size), and growth results according to Comparative Example 1 were set a reference value (100%).

First, in order to examine an effect on the red band PPF, light in which the blue PPF and the green PPF are the same as 1:4, but the red PPFs are differently set as 6, 7, 9 (samples 1 to 3) were used to illustrate the growth results of leafy vegetables and herbs under the same conditions shown in Comparative Example 1 in Table 1 below.

TABLE 1

| Division | Blue PPF | Green PPF | Red PPF | Growth rate of leafy vegetables | Growth rate of herbs |
|---|---|---|---|---|---|
| Comparative Example 1 | 1 | 4 | 4 | 100% | 100% |
| Sample 1 | 1 | 4 | 6 | 110% | 105% |
| Sample 2 | 1 | 4 | 7 | 105% | 100% |
| Sample 3 | 1 | 4 | 9 | 100% | 95% |

As shown in Table 1 above, it can be seen that as the red PPF ratio increases, a growth rate increases, when the red PPF ratio is 7 (sample 2), a growth rate decreases, and when the red PPF ratio is 9 (sample 3), a growth rate rather decreases compared to a reference value.

Based on the above-described results, a desirable red PPF ratio may be defined as a range, greater than 4 and less than 9, for example, in a range of 5 to 7, when the blue PPF is 1. Furthermore, since preferred more desirable condition of the red PPF ratio is 6, the red PPF ratio may be in a range of 5.5 to 6.5 in a certain example.

Next, in order to examine an effect on the green band PPF, growth results of leafy vegetables and herbs under the same conditions as in Comparative Example 1, using light (Examples 1 to 3) in which the blue PPF and the red PPF are equally set to 1:6, but the green PPF is differently set to 6, 8, 10, and 12, were shown in Table 2 below.

TABLE 2

| Division | Blue PPF | Green PPF | Red PPF | Growth rate of leafy vegetables | Growth rate of herbs |
|---|---|---|---|---|---|
| CE 1 | 1 | 4 | 4 | 100% | 100% |
| Example 1 | 1 | 6 | 6 | 115% | 110% |
| Example 2 | 1 | 8 | 6 | 120% | 115% |
| Example 3 | 1 | 10 | 6 | 115% | 110% |
| CE 2 | 1 | 12 | 6 | 105% | 100% |

*CE: Comparative Example

As shown in Table 2 above, it can be seen that as the green PPF ratio increases, a growth rate increases, when the green PPF ratio is 8 (Example 2), a maximum growth rate was illustrated, when the green PPF is 10 (Example 3), a degree of increase of the growth rate decreases, and rather, when the green PPF ratio is 12 (Comparative Example 2), the growth rate decreases compared to the reference value.

Based on the above-described results, desired green PPF ratio may be defined as a range, greater than 4 and less than 12, for example, in a range of 6 to 10, when the blue PPF ratio is 1. Furthermore, more desirable condition of the green PPF ratio may be 8, an even more desirable range may be in a range of 7 to 9.

Figure 7:
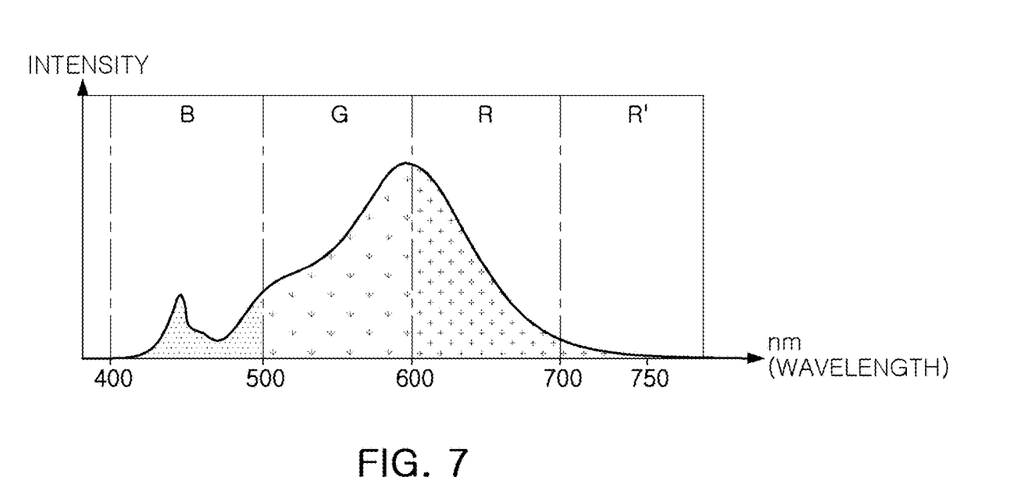
FIGS. 7 to 9 illustrate emission spectra of light according to various example embodiments of the present disclosure.
Figure 8:
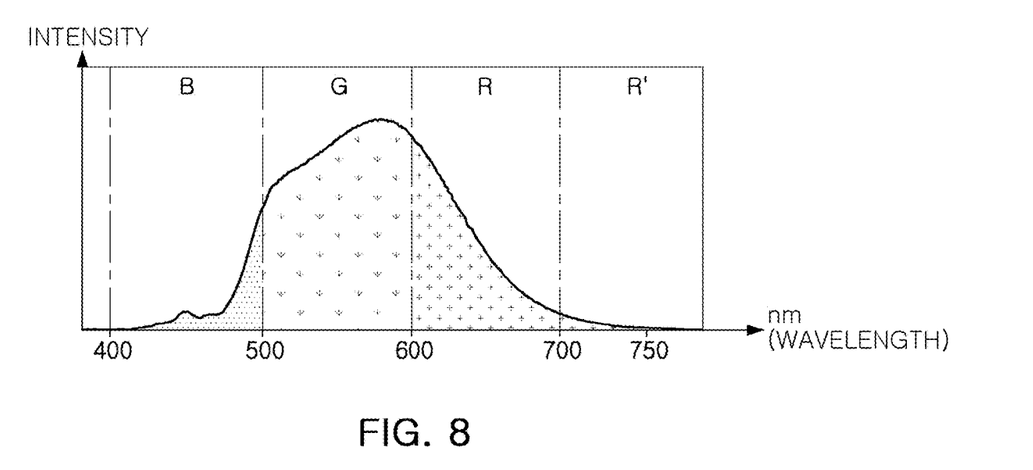

FIGS. 7 and 8 illustrate emission spectrums of light for plant growth according to various example embodiments of the present disclosure, which are emission spectra according to Examples 1 and 3, and an emission spectrum according to Example 2 is shown in Table 2 described above.

The light emitting device according to Examples 1 and 4 shown in FIGS. 7 and 8 were prepared by combining $Lu_3Al_5O_{12}$:Ce having a peak wavelength of 535 nm and (Sr,Ca)$AlSiN_3$:Eu having a peak wavelength of 620 nm, with a blue LED having a 445 nm dominant wavelength, and only mixing ratios of the two phosphors were varied.

The light emitting device according to Example 2 was prepared using (Sr,Ca)$AlSiN_3$:Eu having a peak wavelength of 620 nm as a second phosphor, while having the same blue LED and the first phosphor as the light emitting device according to Examples 1 and 3. In a specific example, $Y_3Al_5O_{12}$:Ce, having a peak wavelength of 555 nm may also be preferably used as a first phosphor.

The above-described PPF value condition for plant growth described above may be implemented by using one wavelength converting material, without using a plurality of wavelength converting materials. As one wavelength converting material, a phosphor having a peak wavelength of 560 nm to 630 nm may be used.

Figure 9:
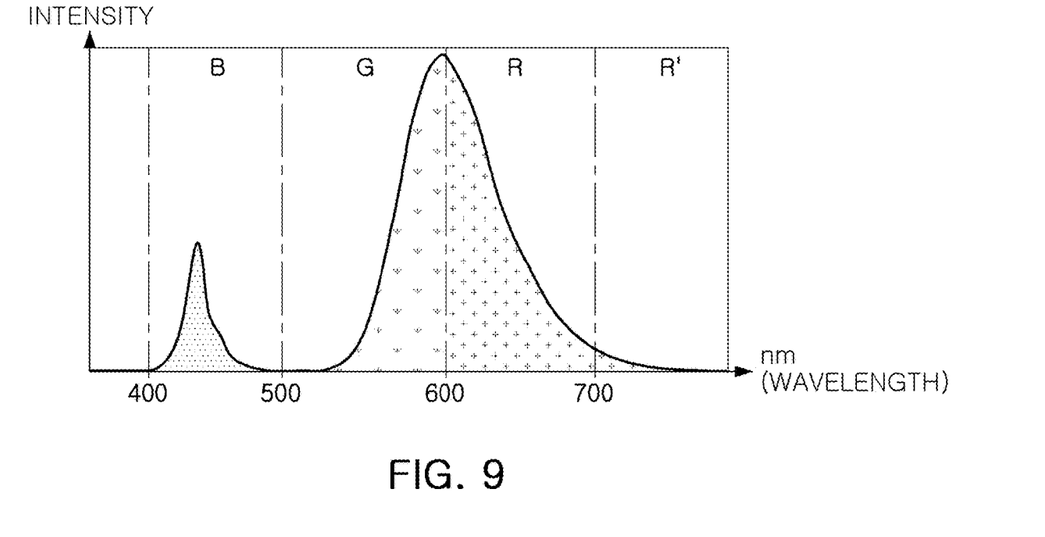

A light emitting device for plant growth satisfying the above-described PPF value conditions for plant growth was prepared using a (Sr,Ca)$AlSiN_3$:Eu phosphor having light of a peak wavelength of 599 nm. Each emission light could have PPF values in the blue, green, and red bands, that is, the 400 nm to 500 nm band, the 500 nm to 600 nm band, and the 600 nm to 700 nm band as shown in Table 3 below. Table 9 shows an emission spectrum according to Example 4.

TABLE 3

| Division | Blue PPF | Green PPF | Red PPF |
|---|---|---|---|
| Example 4 | 1 | 6 | 6 |
| Example 5 | 1 | 8 | 6 |
| Example 6 | 1 | 10 | 6 |

As described above, it was confirmed that the above-described PPF value conditions for plant growth may be implemented as one wavelength converting material, without using two or more wavelength converting materials.

In order to evaluate the color of the light generated by Examples 1 to 6, it was calculated to be shown in a CIE 1931 coordinate system based on each emission spectrum. The results thereof were shown in Table 4 below.

TABLE 4

| Division | Blue PPF | Green PPF | Red PPF | CIE x | CIE y |
|---|---|---|---|---|---|
| Example 1 | 1 | 6 | 6 | 0.3855-0.4939 | 0.4150-0.4774 |
| Example 2 | 1 | 8 | 6 | 0.3713-0.4797 | 0.4464-0.5207 |
| Example 3 | 1 | 10 | 6 | 0.3531-0.4615 | 0.4922-0.5665 |
| Example 4 | 1 | 6 | 6 | 0.4939 | 0.4150 |
| Example 5 | 1 | 8 | 6 | 0.4797 | 0.4464 |
| Example 6 | 1 | 10 | 6 | 0.4615 | 0.4922 |

Figure 10:
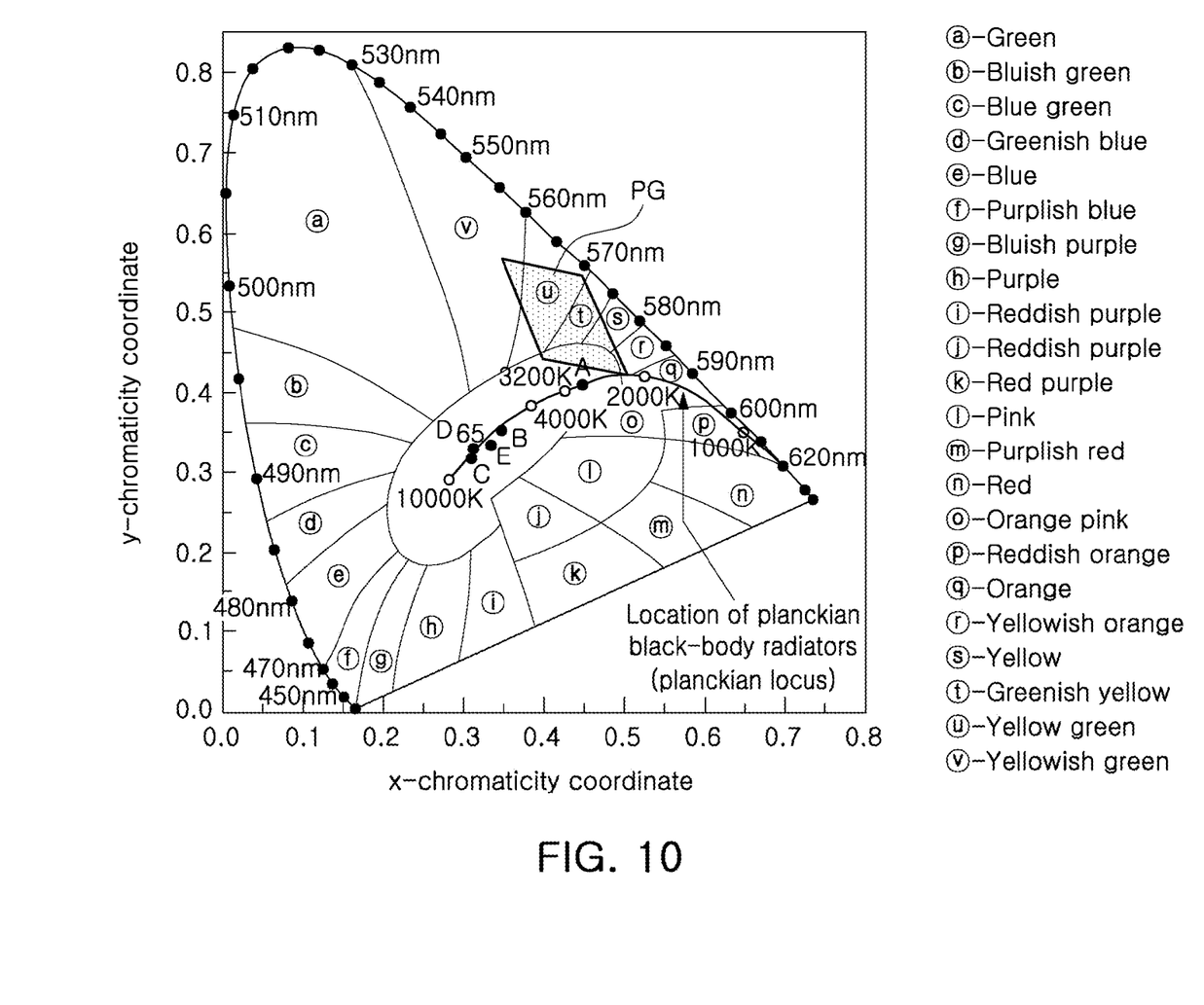
FIG. 10 illustrates a CIE 1931 coordinate system showing a color coordinate region of light for plant growth according to example embodiments of the present disclosure.

The results of Table 4 above were shown by calculating a range of an x coordinate and a range of a y coordinate, respectively, based on the emission spectra of Examples 1 to 6. A color coordinate range obtained through Examples 1 to 3 may be set such that the x coordinate is in a range of 0.3531 to 0.4939 and the y coordinate is in a range of 0.4150 to 0.5665 in the CIE 1931 color coordinate system. FIG. 10 illustrates a CIE 1931 showing a color coordinate region of light according to example embodiments described above.

Referring to FIG. 10, the light for plant growth according to example embodiments mainly deviates from a blackbody trajectory, and is partially present in a white region, but most of the regions correspond to yellowish green, greenish yellow, and yellowish oranges. As described above, the light for plant growth according to example embodiments may be yellowish green light, greenish yellow light or yellow light, or white light close thereto, and in some example embodiments, it may indicate white light or white light close to orange.

The light emitting device according to example embodiments may be provided in a form of a plurality of light emitting modules arranged on a circuit board, and may be provided as a light apparatus for plant growth including one or more of these modules as an artificial light source for plant growth. The light emitting module or the light apparatus for plant growth may be configured only with the light emitting device according to the above-described example embodiments, that is, the light emitting device emitting light satisfying the above-described PPF ratio for each band, but in some example embodiments, the light emitting device according to the above-described example embodiments may be used by combining other white light emitting devices. The light emitting module and the light apparatus according to the example embodiment are shown in FIGS. 11 to 13.

Figure 11:
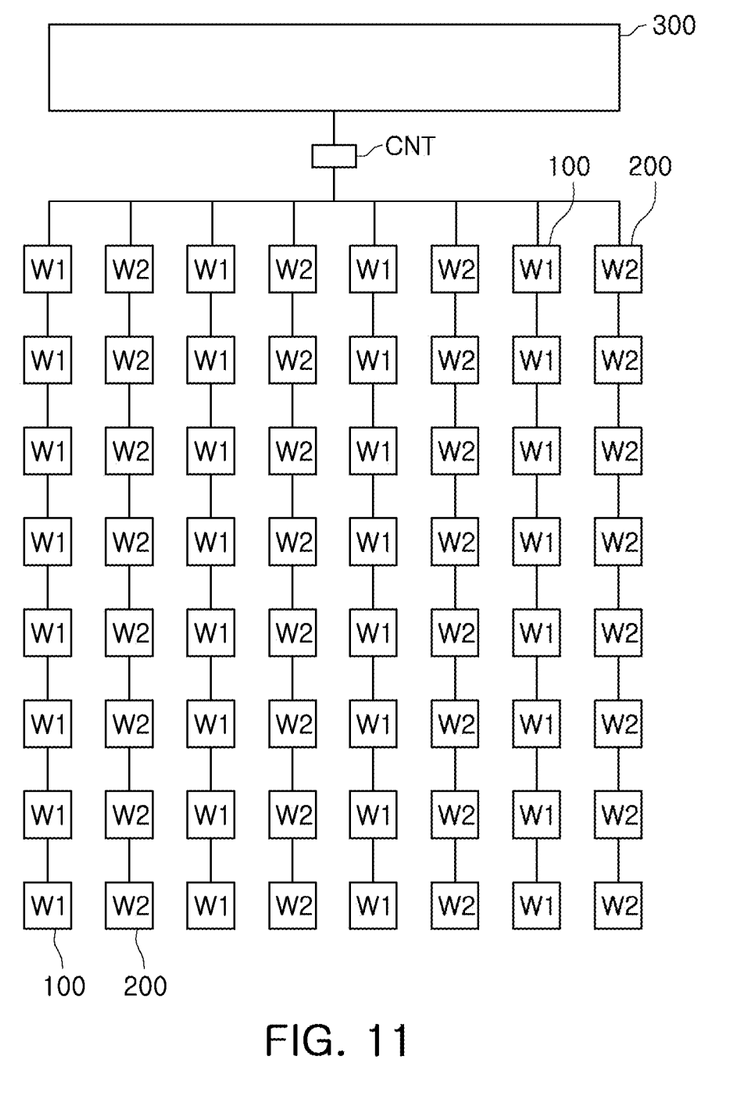
FIG. 11 is a schematic block diagram of a light emitting module for plant growth according to example embodiments of the present disclosure.
Figure 12:
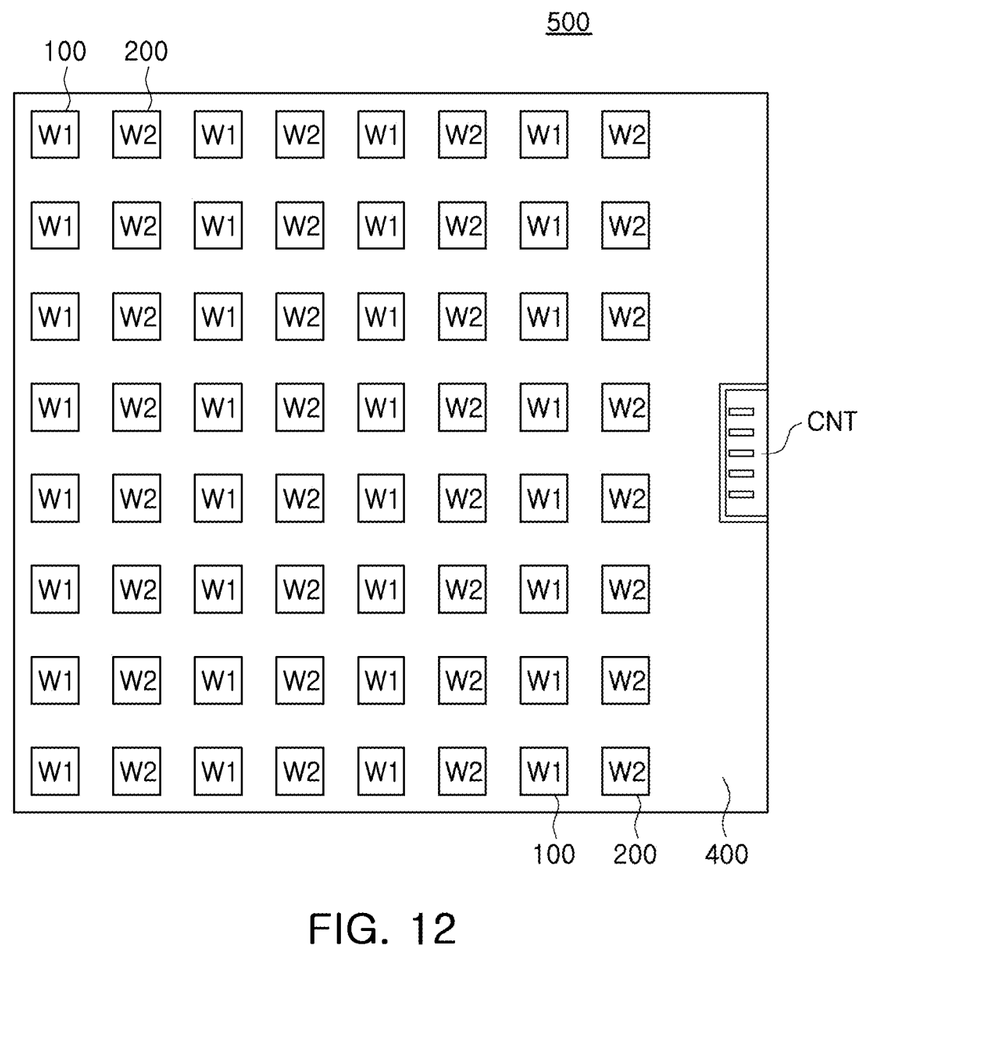
FIG. 12 is a plan view illustrating a light emitting module for plant growth according to example embodiments of the present disclosure.
Figure 13:
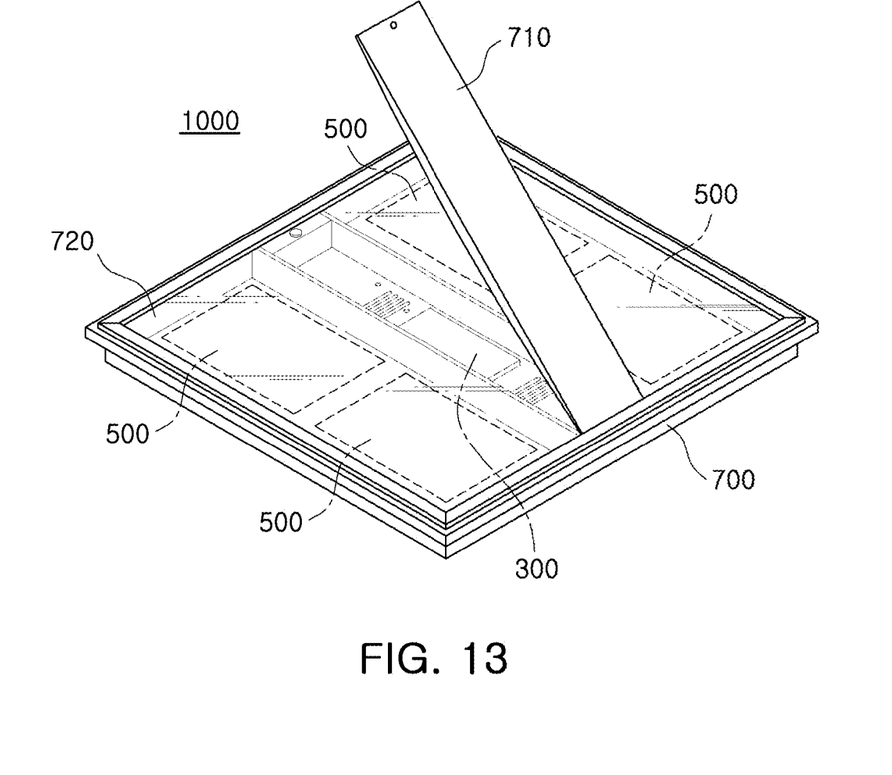
FIG. 13 is a perspective view illustrating a light apparatus for plant growth having the LED module of FIG. 12.

FIG. 11 is a schematic block diagram of a light emitting module for plant growth according to example embodiments of the present disclosure, and FIG. 12 is a plan view illustrating a light emitting module according to example embodiments of the present disclosure.

Referring to FIGS. 11 and 12, a light emitting module 500 according to example embodiments may include a circuit board 400 and a plurality of white light emitting devices 100 and 200 mounted on the circuit board 400.

The plurality of white light emitting devices may include a plurality of first and second light emitting devices 100 and 200 emitting different light. The plurality of first light emitting devices 100 may be configured to emit light for plant growth satisfying the PPF ratio according to example embodiments, and the plurality of second light emitting devices 200 may be configured to emit light having a different emission spectrum from the spectrum of light for plant growth. In some example embodiments, the light of the plurality of second light emitting devices 200 may be configured to emit white light. For example, the white light of the plurality of second light emitting devices 200 may have a color temperature in a range of 2700 to 3500K. In some other example embodiments, the plurality of second light emitting devices 200 may have an emission spectrum different from that of the light of the plurality of first light emitting devices 100, but may have light satisfying the above-described conditions of light for plant growth. For example, the plurality of second light emitting devices 200 may satisfy the conditions that when a photosynthetic photon flux (PPF) of the 400 nm to 500 nm band is 1, a PPF of the 500 nm to 600 nm band is in a range of 6 to 10 and a PPF of the 600 nm to 700 nm band is in a range of 5 to 7.

As illustrated in FIG. 11, the plurality of first and second light emitting devices 100 and 200 may constitute a plurality of strings connected in series, respectively, and the plurality of strings may be connected to each other in parallel. The light emitting module 500 illustrated in FIGS. 11 and 12 may be connected to a DC driver 400 through an interconnection portion CNT provided on one side of the substrate 400. The DC driver 300 may be configured to independently drive respective outputs of the plurality of first light emitting devices 100 and the plurality of second light emitting devices 200. Therefore, respective outputs may be adjusted independently so that appropriate light is provided according to a type of plants.

FIG. 13 is a perspective view illustrating a light apparatus for plant growth having the LED module of FIG. 12.

Referring to FIG. 13, a light apparatus for plant growth according to example embodiments may include a plurality of light emitting devices 500, a DC driver 300, and/or a housing 700. The plurality of light emitting modules 500 may be the light emitting modules illustrated in FIGS. 11 and 12, and a part or all of light sources may be configured as the light emitting device according to example embodiments.

The housing 400 of a light apparatus for plant growth 1000 according to example embodiment may include a housing 500 having a planar shape. The housing 400 may have an accommodation space for accommodating the light emitting module 500 and the DC driver 300. A transparent protective layer 720 may be mounted on a light emitting surface of the housing 400. In some example embodiments, the transparent protective layer 720 may be provided as a component (e.g., a light guide plate or a diffusion plate) coupled to other optical functions. A separate cover 710 may be mounted in a space in which a power related configuration such as the DC driver 300, or the like may be disposed in the housing 400.

As described above, the DC driver 300 may drive the plurality of first and second light emitting devices 100 and 200 through the interconnection portion CNT provided in the light emitting module 500. In some example embodiments, the DC driver 300 may be configured to independently drive respective outputs of the plurality of first and second light emitting devices 100 and 200.

As set forth above, according to example embodiments, a white light emitting device and a light apparatus may provide white light for plant growth with improved light transmittance in terms of photosynthetic efficiency while satisfying conditions of an absorption spectrum for plant growth.

Various and advantageous advantages and effects of the present inventive concepts are not limited to the above description, it will be more readily understood in the process of describing the specific example embodiments of the present inventive concepts.

While example embodiments have been shown and described above, it will be apparent to those skilled in the art that modifications and variations could be made without departing from the scope of the present inventive concepts as defined by the appended claims.

What is claimed is:

1. A light emitting device for plant growth, comprising:
a blue light emitting diode (LED) configured to emit blue light; and
at least one wavelength converting material configured to be excited by the blue light and
convert a portion of the blue light into converted light having a different wavelength, the
converted light being light for plant growth,
wherein an emission spectrum of the light for plant growth is when a photosynthetic photon flux (PPF) of a 400 nm to 500 nm band is 1, a PPF of a 500 nm to 600 nm band is in a range of 6 to 10, and a PPF of a 600 nm to 700 nm band is in a range of 5 to 7.

2. The light emitting device for plant growth of claim 1, wherein the PPF of the 500 nm to 600 nm band is in a range of 7 to 9.

3. The light emitting device for plant growth of claim 1, wherein the light for plant growth has an x coordinate in a range of 0.3531 to 0.4939 and a y coordinate in a range of 0.4150 to 0.5665 in a CIE 1931 color coordinate system.

4. The light emitting device for plant growth of claim 1, wherein the emission spectrum of the light for plant growth satisfies a condition in which a PPF of a 700 nm or more band is in a range of 1.5 or less.

5. The light emitting device for plant growth of claim 1, wherein the blue light emitting diode emits blue light having a dominant wavelength of 430 to 470 nm.

6. The light emitting device for plant growth of claim 1, wherein the at least one wavelength converting material is a plurality of wavelength converting materials, and the plurality of wavelength converting materials comprise a first phosphor configured to convert the blue light into first light having a peak wavelength of 500 nm to 580 nm and a second phosphor configured to convert the blue light into second light having a peak wavelength of 600 nm to 660 nm.

7. The light emitting device for plant growth of claim 6, wherein the first phosphor comprises at least one phosphor selected from a group consisting of $(Ga,Gd,Y,Lu)_3Al_5O_{12}$:Ce, $La_3Si_6N_{11}$:Ce, $(Sr,Ca,Ba)Si_2O_2N_2$:Eu, $(Sr,Ba)_2SiO_4$:Eu, β-SiAlON:Eu, and a combination thereof.

8. The light emitting device for plant growth of claim 6, wherein the second phosphor comprises at least one phosphor selected from a group consisting of $(Sr,Ca)AlSiN_3$:Eu, $K_xSiF_y$:$Mn^{4+}$($2 \leq x \leq 3$, $4 \leq y \leq 7$), and a combination thereof.

9. The light emitting device for plant growth of claim 6, wherein at least one of the first and second phosphors comprises a plurality of phosphors configured to convert light having different peaks.

10. The light emitting device for plant growth of claim 6, wherein the first second phosphor is configured to convert light having a peak wavelength of 530 nm to 560 nm, and the second phosphor is configured to convert light having a peak wavelength of 610 nm to 650 nm.

11. The light emitting device for plant growth of claim 10, wherein the first phosphor comprises $(Ga,Gd,Y,Lu)_3Al_5O_{12}$:Ce, and the second phosphor comprises $(Sr,Ca)AlSiN_3$:Eu.

12. The light emitting device for plant growth of claim 1, wherein the at least one wavelength converting material is a single wavelength converting material, and the single wavelength converting material comprises a phosphor configured to convert the blue light into light having a peak wavelength of 560 nm to 630 nm.

13. The light emitting device for plant growth of claim 12, wherein the single wavelength converting material comprises a phosphor, $(Sr,Ca)AlSiN_3$:Eu.

14. A light emitting device for plant growth, comprising:
a blue light emitting diode configured to emit blue light having a dominant wavelength in a range of 430 nm to 470 nm;
a first wavelength converting material configured to be excited by the blue light and emit first light having a peak wavelength of 530 nm to 560 nm; and
a second wavelength converting material configured to be excited by the blue light and emit second light having a peak wavelength of 610 nm to 650 nm,
wherein light for plant growth is emitted by mixing the blue light with the first and second light,
an emission spectrum of the light for plant growth is when a PPF of a 400 nm to 500 nm band is 1, a PPF of a 500 nm to 600 nm band is in a range of 6 to 10, and a PPF of a 600 nm to 700 nm band is in a range of 5 to 7, and
the light for plant growth has an x coordinate in a range of 0.3531 to 0.4939 and a y coordinate in a range of 0.4150 to 0.5665 in a CIE 1931 color coordinate system.

15. The light emitting device for plant growth of claim 14, wherein a PPF of the 500 nm to 600 nm band is in a range of 7 to 9.

16. The light emitting device for plant growth of claim 14, wherein the first wavelength converting material comprises $(Ga,Gd,Y,Lu)_3Al_5O_{12}$:Ce, and the second wavelength converting material comprises $(Ca,Sr)AlSiN_3$:Eu.

17. A light apparatus for plant growth, comprising:
a circuit board; and
a plurality of light emitting devices on the circuit board,
wherein the plurality of light emitting devices comprise a blue light emitting diode (LED) configured to emit blue light, and at least one wavelength converting material configured to be excited by the blue light and convert a portion of the blue light into converted light having a different wavelength, the plurality of light emitting devices including a plurality of first light emitting devices configured to emit light for plant growth,
wherein an emission spectrum of the light for plant growth is when a photosynthetic photon flux (PPF) in a 400 nm to 500 nm band is 1, a PPF in a 500 nm to 600 nm is in a range of 6 to 10, and a PPF in a 600 nm to 700 nm band is in a range of 5 to 7.

18. The light apparatus for plant growth of claim 17, wherein the plurality of light emitting devices further comprise a plurality of second light emitting devices configured to emit light having a different emission spectrum from the light for plant growth.

19. The light apparatus for plant growth of claim 18, wherein the emission light of the plurality of second light emitting devices is white light having a color temperature in a range of 2700 to 3500K.

20. The light apparatus for plant growth of claim 18, wherein the emission spectrum different from that of the plurality of light emitting devices is when a photosynthetic photon flux (PPF) of a 400 nm to 500 nm band is 1, a PPF of a 500 nm to 600 nm band is in a range of 6 to 10, and a PPF of a 600 nm to 700 nm is in a range of 5 to 7.

* * * * *